Sept. 18, 1956 F. V. FROLA ET AL 2,763,822

SILICON SEMICONDUCTOR DEVICES

Filed May 10, 1955

WITNESSES

Edwin E. Bassler

Leon M. Garman

INVENTORS
Frank V. Frola &
Milo W. Slye
BY
Frederick Shapoe
ATTORNEY

United States Patent Office 2,763,822

Patented Sept. 18, 1956

2,763,822

SILICON SEMICONDUCTOR DEVICES

Frank V. Frola, Turtle Creek, and Milo W. Slye, Pittsburgh, Pa., assignors to Westinghouse Electric Corporation, East Pittsburgh, Pa., a corporation of Pennsylvania Application May 10, 1955, Serial No. 507,312

8 Claims. (Cl. 317—234)

This invention relates to semiconductor devices and in particular to silicon semiconductor rectifiers of the P-N junction type which are specially adapted for power purposes.

It has long been desirable to provide semiconductor devices comprising a member of silicon provided with at least one P-N junction. When alternating electrical current is applied to one side of the P-N junction, rectification takes place since the junction has low impedance to current flow from the P-type to the N-type areas but very high impedance to current flow from the N-type to the P-type areas of the silicon member.

The outstanding advantages of the silicon P-N junction material is that it has a high rectifier effciency at all temperatures up to about 220° C. Germanium rectifiers on the other hand become quite inefficient at temperatures approaching 100° C. As a consequence rectifiers prepared from germanium must be cooled with great care in order to prevent the temperatures from exceeding a certain predetermined maximum, ordinarily about 80° C. High capacity silicon diode rectifiers on the other hand can be adequately air-cooled by conducting heat therefrom to simple fins or other radiator of moderate size. As a consequence, silicon rectifiers may be safely employed under conditions where the ambient temperatures are extremely high or where, because of the heavy loads, it would be difficult to maintain temperatures of the rectifiers below 100° C.

The preparation of P-N junction semiconductor devices from silicon requires the solution of many difficult problems. The silicon material itself must be employed in the form of extremely thin wafers whose thickness is of the order of 10 mils (0.010 inch). The silicon wafers are quite brittle and fragile so that they will break or shatter if subjected to any appreciable mechanical stresses. Breakage may be encountered not only during the manufacture and assembly of the rectifiers but also during use by reason of differential thermal expansion that takes place between the wafer of silicon and an end contact to which it is affixed, as the rectifier device embodying them heats up in use.

One of the critical problems in preparing satisfactory rectifiers from silicon semiconductor materials is to dissipate rapidly and efficiently the heat developed during use. While silicon has the ability to rectify electrical current at elevated temperatures of up to 220° C., the most efficient rectification takes place at lower temperatures. Therefore, the lowest possible operating temperatures should be maintained. Excessive temperatures, beginning at about 220° C., may impair operation of the rectifier devices and even cause failure of the rectifier if it is subjected to heavy electrical loads while at such elevated temperatures. The silicon wafer must be mounted on an end contact of a highly heat conducting metal such as molybdenum, and a solder must be employed to assure good thermal and electrical contact. The term "solder" is used in the broadest sense to include brazing.

Other problems involved in producing satisfactory rectifying devices relate to the protection of the silicon wafers from adverse atmospheres and contamination. Since for silicon conductor applications the silicon should be of the highest order of purity, ordinarily having less than one part by weight of impurity per 10 million parts of silicon; moisture, small particles of dirt, and the like settling on the silicon can react or diffuse into the silicon wafer and result in damage or impairment of its efficiency in rectification.

The object of this invention is to provide a semiconducting member comprising silicon bonded to a heat absorbing and dissipating contact member by means of a solder composed of silver alloyed with at least one element of group IV–B of the periodic table excluding carbon.

A furthur object of the invention is to provide a semiconductor rectifier device wherein silicon with a P-N junction is bonded by a fused layer of an alloy composed of silver and at least one element from the group consisting of tin, silicon, germanium and lead, to an end contact or support of molybdenum, tungsten or base alloys thereof.

A still further object is to provide an air-cooled power rectifier comprising heat radiator means and a hermetically sealed casing within which is an end contact of molybdenum bonded to a silicon wafer by a solder composed of silver alloyed with at least one element of the group consisting of tin, silicon, germanium and lead.

Another object of the invention is to provide a process for producing unitary semiconductor rectifier devices by heating to a temperature of between 850° C. to 925° C. a silicon wafer, a molybdenum or tungsten end contact, and a fusible solder of an alloy composed of silver and at least one element from the group consisting of tin, silicon, germanium, and lead.

For a better understanding of the nature and objects of the invention attention is directed to the accompanying drawing, in which Fig. 1 is a vertical cross-section through an assembly prior to fusion;

Figures 1, 2, 3:
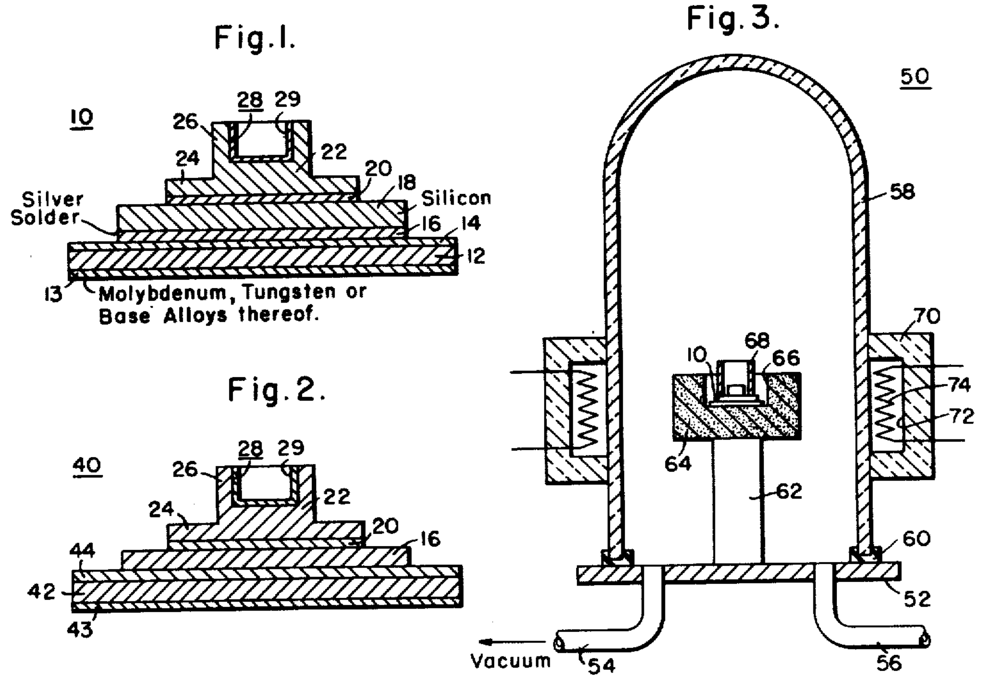
Fig. 2 is a vertical cross-section of a modified form of assembly.
Fig. 3 is a vertical cross-section through a vacuum furnace suitable for producing bonded silicon rectifier elements.

Briefly, we have discovered that it is possible to produce outstanding semiconductor devices, and particularly P-N junction rectifiers, by bonding silicon wafers by means of selected silver alloys to a heat dissipating and supporting end contact of molybdenum, tungsten or base alloys thereof. The properly bonded silicon wafer is protected from damage over the widest ranges of temperature fluctuations, and heat developed in the silicon wafer during use as a rectifier is conducted away rapidly to the end contact by the solder.

A number of critical requirements must be met by a solder composition in order to produce the best silicon rectifier diode units. In particular, the solder must have the following properties:

1. Wet and bond to silicon both while in the molten state and in the solidified state.

2. Wet and bond to molybdenum, tungsten and base alloys thereof, both while in the molten and solidified state.

3. Have low electrical and thermal resistance.

4. Have a suitable matching coefficient of thermal expansion and good ductility which will enable the solder to unite a silicon wafer to a molybdenum end contact over a temperature range of 925° C. to −100° C. without breaking away from or damaging the silicon.

5. Will not contaminate, adversely react with or otherwise impair the properties of the silicon wafer.

6. Low vapor pressure at elevated temperatures so that leakage paths are not produced during soldering and other high temperature operations.

7. Require no flux to secure a good metal-to-metal bond.

In particular, we have discovered that highly satisfactory silicon semiconductor devices may be prepared by bonding silicon to an end contact, of molybdenum, for instance, by means of a silver solder composed of an alloy of silver and at least one element from group IV–B of the periodic table selected from the group consisting of tin, silicon, germanium and lead. These solders satisfactorily meet all the requirements above set forth. The alloys are composed of at least 5% silver, the balance not exceeding 90% by weight of tin, not exceeding 20% by weight of silicon, not exceeding 50% by weight of germanium and not exceeding 95% by weight of lead. Particularly good results have been obtained with binary alloys comprising silver and from 65% to 90% of tin; silver and from 5% to 16% by weight of silicon; silver and from 25% to 50% by weight of lead; and, silver and from 5% to 30% by weight of germanium. Ternary alloys of silver, tin and silicon; silver, lead and silicon; and silver, germanium and silicon are particularly advantageous. For example, the ternary alloys may comprise 50% to 80% silver and 5% to 16% silicon, the balance being tin, lead or germanium. The silver may include small amounts of other elements and impurities, providing, however, that no significant amount of a group III element is present.

When these silver alloys are applied to the silicon wafer, some of the silicon from the wafer dissolves in the alloy and, consequently, binary and ternary alloys which are applied without silicon being present therein will, after fusion, contain a small but substantial amount of silicon. Thus, an alloy comprising 85% silver, 10% tin and 5% germanium applied to a silicon wafer will, after fusion, contain from 5% to 16% by weight of silicon, depending upon the length of time and the temperatures to which the solder alloy and the silicon are subjected.

We have secured excellent results with alloys comprising from 2% to 5% by weight of germanium, the balance, 98% to 95%, being silver. Thin sheets of these binary silver alloys have been applied to the silicon wafers and after heating the assembly to brazing temperatures, the silver alloy heats and bonds to the silicon, and a portion of the silicon diffuses therein so that the fused bonding layer may comprise from 5% to 16% by weight of silicon, 1% to 4.5% by weight of germanium and the balance being silver. The germanium-silver alloy is ductile and may be readily rolled into thin films of a thickness of from 1 to 2 mils. The thin films may be then cut or punched into small pieces of approximately the same area as the silicon wafers and applied thereto. However, the alloy may be prepared in powder or granular form and a thin layer thereof applied to the end contact either dry or in the form of a paste in a volatile solvent, such as ethyl alcohol.

Reference should be made to Fig. 1 of the drawing where there is illustrated an assembly 10 of the rectifier components previous to being heated in a furnace to cause fusion and bonding of all of the components into a unitary rectifier device. The assembly 10 comprises an end contact 12 which may be of a substantial thickness of the order of 20 to 100 mils and from ¼ to 2 inches in diameter, and even greater in the case of large rectifiers. The end contact comprises a metal selected from the group containing molybdenum, tungsten or base alloys thereof. Both molybdenum and tungsten have a coefficient of linear thermal expansion corresponding closely to that of single crystal, silicon (about $4.2\times10^{-6}$ per degree centigrade). Alloys of molybdenum and tungsten, for example an alloy composed of 5% tungsten and 95% molybdenum, also have nearly the same coefficient of thermal expansion as silicon. Both molybdenum and tungsten can be alloyed with minor amounts of other metals without greatly changing their coefficient of thermal expansion. Thus, molybdenum may be alloyed with 5% to 25% by weight of a platinum metal, for example osmium or platinum, chromium, nickel, cobalt, silicon, copper and silver. A coefficient of thermal expansion of between about $3.8\times10^{-6}$ and $5\times10^{-6}$ per degree centigrade is satisfactory for cooperation with a silicon wafer. Molybdenum has given outstanding results in practice. While both molybdenum and tungsten have excellent thermal conductivities so that they will carry away heat rapidly from silicon disposed in contact therewith, the molybdenum has a much lower density and for many applications it will be found preferable. Thus, in equipment which is subject to motion, members of the lighter molybdenum will have lower inertia effects than a similar size member of tungsten. Hereinafter, molybdenum will be specifically referred to, but it will be understood that tungsten or an alloy of either tungsten or molybdenum can be substituted therefor.

The molybdenum end contact 12 is carefully cleaned by abrading, etching and washing or any one such as abrading with a sand blast, to remove all surface contamination therefrom. In order to produce the best bonding, it has been found desirable to apply beforehand a thin coating 13 and 14 of silver or of an alloy of silver to both of the face surfaces of the contact 12. We have initially applied a coating 13 of silver solely to the lower surface. A satisfactory method of applying the silver is to coat the face surfaces with silver or an alloy comprising 95% silver and 5% germanium, either in the form of a thin sheet or fine powder, and heating the molybdenum so treated in a vacuum or a hydrogen atmosphere at 1200° C. The silver will rapidly wet the surface of the molybdenum and spread thereover uniformly. In other instances, we have first coated the molybdenum surfaces with a nickel phosphide coating following the procedure set forth in application Serial No. 301,016, assigned to the same assignee as the instant application. A coating of the nickel phosphide is chemically deposited from an aqueous solution containing, for example, 0.02 mole/liter of nickel sulfate, 0.07 mole/liter of $NiCl_2$, and 0.225 mole/liter of sodium hypophosphite upon simply immersing the molybdenum members therein. After the members have been immersed for a period of time of the order of five minutes to 30 minutes they may be removed from the solution, dried and then heated to a temperature of 1200° C. for one-quarter of an hour or longer. A thin coating of nickel phosphide comprising 95% or more nickel, will cover the molybdenum surfaces, and it may then be silver plated in a conventional type of silver cyanide electroplating solution to apply thereto approximately a coating of 1 mil thickness of silver 14.

There is then placed upon the silver coating 14 of the molybdenum end contact 12 a layer 16 of the silver alloy to function as a solder between the silicon wafer 18 and the end contact 12. We have employed with considerable success films or foils of silver and silver alloys, the foils being of a thickness of from 1 to 2 mils, and being of substantially the same area as a silicon wafer 18 placed thereon. However, the silver or silver alloy may be applied in the form of powder, paste and the like with satisfactory results. The upper surface of the end contact 12 is illustrated as being flat as is the lower surface of the silicon surface 18. However, it will be understood that while flat surfaced members are particularly convenient to prepare and employ, other shapes may be made and used. In all cases, it is necessary that the meeting surfaces of the end contact and the silicon wafer conform closely to one another so that a good silver alloy solder bond eventually result to provide for the best possible thermal conductivity.

The silicon wafer 18 will ordinarily be of a thickness of approximately 10 mils. Substantially greater thicknesses, such as 25 mils, for instance, result in less effective rectifier operation, while a substantially thinner silicon wafer, below 5 mils, for instance, may be subjected to striking through or otherwise failing. The silicon wafer comprises a single crystal and will have N-type conductivity. The silicon wafer is prepared with finely polished or lapped surfaces which are etched in a solvent, such as the HF—$HNO_3$ and mercury solution set forth in Patent 2,705,192 to remove any surface impurity, loose particles, projections, roughness, and the like.

Upon the upper surface of the silicon wafer 18 there is placed a thin layer 20 comprising for example a foil of a thickness of from 1 to 2 mils of aluminum or an aluminum base alloy, and preferably an alloy of aluminum with an element from group III or IV, such, for example, as silicon, gallium, indium and germanium, which functions not only to enable soldering or bonding of the silicon wafer to an upper contact 22, but also produces P-type conductivity by diffusion into the upper portion of the N-type silicon wafer. The layer 20 may comprise pure aluminum with only slight amounts of impurities being present, such as magnesium, sodium, zinc, and the like, or an alloy composed of aluminum as a major component, the balance being silicon, gallium, indium, and germanium individually or any two or all of the latter being present. These alloys should be solid up to about 300° C. Thus, a foil of 95% aluminum and 5% silicon; 88.4% aluminum—11.6% silicon; 90% aluminum—10% germanium; 47% aluminum—53% germanium; 88% aluminum—12% indium; 96% aluminum—4% by weight of indium; 50% aluminum—20% silicon—20% indium—10% germanium; 90% aluminum—5% silicon—5% indium; 85% aluminum—5% silicon—5% indium—5% germanium; and 88% aluminum—5% silicon—2% indium—3% germanium and 2% indium may be employed (all parts being by weight). It is critical that the aluminum layer 20 be substantially smaller than the area of the silicon wafer 18, and that it be centered on the wafer 18 with a substantial clearance from the corners or edge of wafer 18. It is not necessary that the aluminum layer 20 be a foil or a separate layer. We have found it possible to vapor coat aluminum or the aluminum base alloy in a vacuum upon the lower surface of an upper contact 22. Alternatively, the selected central portions of the upper surface of the silicon wafer may be vapor coated with aluminum or aluminum base alloy, by masking the edges of the wafer.

The upper contact 22 is preferably composed of the same metal as the lower contact; namely, molybdenum, tungsten or base alloys thereof. The upper contact comprises a flat disc portion 24, which is smaller in area than the upper surface of the silicon wafer 18. The contact 22 comprises an upwardly extending button 26 provided with a cup or well 28 adapted to receive the end of a conductor. The upper contact 22 may be readily prepared from molybdenum by machining. We have found it desirable to coat only the well 28 of the contact 22 with a thin coating 29 of a suitable solder, such as 70% silver—30% gold alloy, 97% silver—3% germanium alloy, gold alone, or an alloy comprising 95% silver and 5% silicon. Care must be observed to prevent any silver being present at or near the edges of the disc portion 24 and aluminum layer 20 to avoid a short-circuit connection being produced.

The upper contact 22 may be of a simpler construction than shown in Fig. 1. Thus, round discs may be punched from a 30 mil to 50 mil thick sheet of molybdenum, then the round discs are counterbored to a depth of from 15 to 25 mils, to produce a cup or well which well is then coated with a solder, such as 95% silver—5% germanium alloy.

It will be understood that the upper contact need not have a cup or well, though such cup is advantageous for soldering of a conductor thereto. The upper contact can be of any suitable shape or structure which will enable firm bonding of a conductor thereto as by soldering and will be satisfactory.

In some instances, we have been able to reduce the number of parts in the rectifier assembly in the manner shown in Fig. 2 of the drawing. The assembly 40 in Fig. 2 comprises an end contact 42 of molybdenum on which there is applied to both the upper and lower surfaces a coating 43 and 44 of the order of 2 mils thickness of silver or silver alloy. Such silver coating may comprise a foil of silver alloy applied to the bottom and upper sides of the molybdenum member 42 and the assembly introduced into a furnace with a protective atmosphere of hydrogen or in a vacuum and heated to 1200° C. for 15 minutes in order to fuse the silver thereto. A suitable alloy for this coating 43—44 is one of 95% silver and 5% germanium. The remainder of the assembly, namely, the silicon wafer 16, the aluminum layer 20, and the upper contact 22, are similar to the arrangement illustrated in Fig. 1 of the drawing.

The assembly of Fig. 1 or 2 is then placed within a furnace 50, illustrated in Fig. 3 of the drawing. The furnace comprises a base 52 through which pass conduits 54 connected with a pump or other source capable of producing a high vacuum and another conduit 56 for introducing a protective gas, such a helium, argon, or the like, and for breaking the vacuum which may be created in the furnace. The furnace proper comprises a bell 58 of a heat resisting glass, such as, for example, a 96% silicon dioxide glass, fitting into a sealing gasket 60 applied to the base 52. A refractory support 62 mounted on the base 52 is adapted to suspend a graphite block 64 provided with one or more cavities 66 adapted to receive the assembly 10, such as shown in Fig. 1 of the drawing. A weight 68 of a high melting point non-reactive metal or other material, such as graphite, is applied upon the contact 22 of the assembly in order to apply a suitable light pressure to the assembly. An encircling heater 70 comprising a heating element 74 disposed within an annular groove 72 is adapted to be lowered about the bell 58 in order to heat the graphite block 64 by radiating heat thereto.

In practice, we have placed a number of assemblies 10 within the graphite block 64, placed the bell 58 thereover in position in the gasket 60 and evacuated the space within the bell 58 through the conduit 54. The pressure within the bell 58 is reduced to an extremely low value of less than 0.01 micron. Heat is then radiated to the graphite block 64 by energizing the resistance heating element 74. Usually heating causes evolution of gases and evacuation is continued throughout the operation. A thermocouple is placed within the depression 66 adjacent the assembly 10 in order to determine the temperature present therein.

The maximum temperatures necessary for satisfactory bonding of the assembly 10 have been from 850° C. to 925° C. The aluminum or aluminum alloy layer 20 will not properly wet silicon and molybdenum until temperatures of at least about 570° C. are attained, and 800° C. is usually required for best results. Particularly good results have been obtained when the temperatures of the furnace was controlled so that assembly 10 reached a peak of from 870° C. to 900° C. Such peak temperatures are held for a brief period of time, ordinarily not over a minute, and the temperature is then promptly reduced. No particular differences have been found in rectifiers wherein the rate of heating, and the corresponding rate of cooling, was varied to such an extent that the temperature rise from 100° C. to 875° C. took place in as short a time as 5 minutes or as long as 60 minutes. We have found that the silver solders of the present invention wet both silicon and bolybdenum rapidly and dissolve a small amount of the silicon in a short while after they reach their melting point; holding for any excessive times while the silver alloy is fused does not produce any particularly beneficial results.

The upper surface of the N-type silicon wafer 18 is wetted by the molten aluminum layer 20 and the aluminum diffuses into the N-type silicon wafer, producing a P-type layer contiguous with the aluminum which is of closely the same area as that of layer 20 at the upper surface. Therefore, a P-N junction results in the silicon.

The temperature required for the bonding of the silicon to the molybdenum end contact 12 is dependent on the fusion point of the silver solder 16. While some of the solders of the present invention have been found to melt as low as about 225° C., we prefer to employ solders whose melting point is at least 400° C. and preferably of the order of 600° C. to 700° C. Wetting of the silicon does not occur below about 570° C., and usually occurs at about 800° C. In no event is it desirable to employ any solder that requires a temperature of substantially over 925° C. to cause fusion and bonding. At temperatures well above 950° C. a detrimental effect has been found to take place in the silicon so that unsatisfactory rectifiers are produced.

After the assembly 10, or the assembly 40, has been subjected to heating in the furnace to cause fusion of the silver base solders with bonding of the components into a unitary diode or rectifier member, the resulting diode members are placed in a hermetically sealed metal casing. The end contact 12 is soldered to the metal casing by coating 13 to enable heat to be conducted to the casing. The metal casing is associated with an efficient radiator dissipating heat to the atmosphere. If desired, the casing can be partly or completely filled with an insulating dielectric liquid to assist heat dissipation. However, such dielectric liquid is not necessary.

Figure 4:
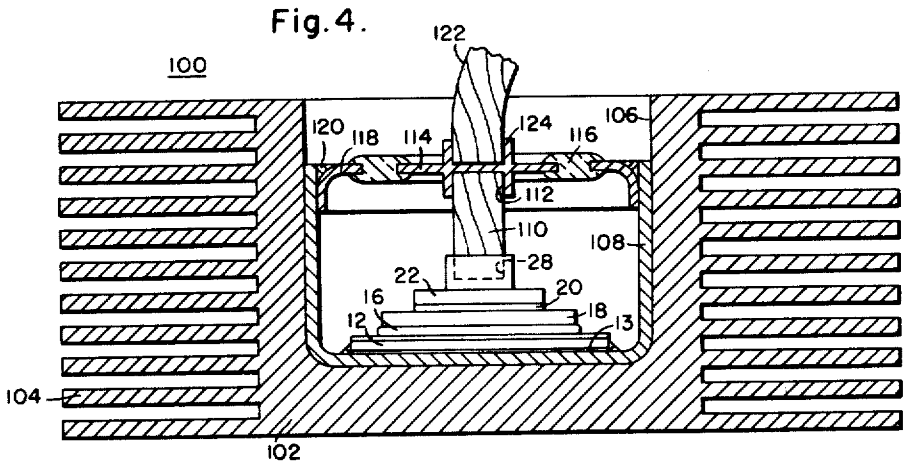
Fig. 4 is an enlarged vertical cross-section of a complete air-cooled rectifier device embodying a silicon P-N junction.

A particularly satisfactory complete air-cooled rectifier device is the unit shown in Fig. 4 of the drawing. The complete rectifier device 100 comprises a body 102 of aluminum or copper or other suitable good heat conducting metal or alloy. The periphery of the body 102 is provided with a plurality of fins for dissipating heat rapidly to the air. The body 102 comprises a well 106 within which is placed a closely fitting, hermetically sealed casing 108 which encloses the rectifier assembly 10. The casing 108 may be soldered to the walls of the well 106. A flexible conductor of copper or silver soldered to well 28 in the upper contact 22 extends upwardly to and is soldered within a cavity 112 of a bushing 114. The bushing 114 comprises an electrically insulating ring 116 of glass bonded to a flanged ring 118, of the nickel-iron-chromium alloy known as Kovar alloy, hermetically united by solder 120 to the wall of the metallic casing 108. A flexible conductor 122 is attached to a cup 124 disposed in the exterior portion of the bushing 114. Alternating current to be rectified is carried by the conductor 122 to bushing 114, thence to the conductor 110, and to the upper part of the silicon wafer 18 which has a P-N junction. Another current conductor is attached to the body 102 by means not shown. Electrical current is carried by such other conductor, the end contact 12 and the silicon wafer in circuit with each other.

Rectifiers similar to those shown in Fig. 4 of the drawing have been produced and tested with exceptionally satisfactory results. They may be employed at ambients of below −100° C. to about 220° C. Thus, with a silicon wafer of a diameter of one-quarter inch, we have been able to rectify from 5 to 30 amperes depending on the size of the fins 104 and the available cooling. By blowing air by means of a fan through circular fins 104 of a depth of about one inch, we have been able to rectify for short periods of time of the order of one hour, 60 amperes of electrical current at 100 volts through this same unit. In one instance, a silicon rectifier constructed as shown in Fig. 4 with a silicon wafer ⅝ inch in diameter rectified 700 amperes of electrical current for a brief period of time with fan cooling.

For a one-quarter inch diameter silicon diode, the forward drop was between 0.8 to 1 volt at 30 amperes. The inverse current was 1 milliampere at 100 volts. We have been able to successfully rectify electrical current at voltages of up to 300 volts with the rectifiers constructed as illustrated in Fig. 4 The reverse current increases slowly with the temperature rise above room temperature. At 100 volts, the silicon diode rectifier had an inverse current of approximately 10 milliamperes at 160° C.

Rectifiers constructed in accordance with the present invention have functioned satisfactorily for long periods of time at temperatures of 200° C. without difficulty and with outstanding efficiency for such elevated temperatures.

For rectifiers to be employed in radio, television and other electronic devices requiring only small rectified currents, such as from 1 milliampere to 100 milliamperes, the rectifier diode assembly 10 can be placed in a glass or ceramic receptacle with two bushings, such as 114 of Fig. 4, sealed to the glass walls to pass the conductors to the interior, the end contact 12 being soldered to the glass walls by a metal coating such as a platinum glaze on the glass wall in order to dissipate heat to the glass wall.

It will be understood that the above description and drawings are illustrative and not limiting.

We claim as our invention:

1. In a semiconductor device, in combination, a semiconducting member comprising silicon, a contact member having a surface closely conforming to and disposed adjacent to a surface of the semiconducting member, the contact member composed of a metal selected from the group consisting of molybdenum, tungsten and base alloys thereof having a coefficient of thermal expansion corresponding closely to that of silicon, and a fused layer disposed between and bonded to said adjacent conforming surfaces, the fused layer consisting of an alloy of silver and at least one element of group IV–B of the periodic table selected from the group consisting of tin, silicon, germanium and lead, the alloy composed of at least 5% silver, the balance not exceeding 90% by weight of tin, not exceeding 20% by weight of silicon, not exceeding 50% by weight of germanium, not exceeding 95% by weight of lead.

2. A semiconductor rectifier comprising, in combination, a silicon wafer having a surface, a first contact member having a surface closely conforming to and disposed adjacent to the said surface of the silicon wafer, the contact member composed of a metal selected from the group consisting of molybdenum, tungsten and base alloys thereof having a coefficient of thermal expansion corresponding closely to that of the silicon wafer, and a fused layer disposed between and bonded to said adjacent conforming surfaces, the fused layer consisting of an alloy composed of silver and at least one element selected from the group consisting of tin, silicon, germanium and lead, the alloy composed of at least 5% by weight silver, the alloy not exceeding 95% tin, not exceeding 20% silicon, not exceeding 50% germanium and not exceeding 95% lead, the fused alloy having a melting point of between 225° C. and 925° C., and a second contact member of the metal employed for the first contact bonded to another surface of the silicon wafer.

3. A semiconductor diode comprising, in combination, an end contact member with at least one flat surface and composed of a metal selected from the group consisting of molybdenum, tungsten and base alloys thereof having a coefficient of thermal expansion corresponding closely to that of silicon, a wafer of silicon having N-type conductivity and having two flat surfaces, superimposed on the flat surface of the end contact member, a fused layer disposed between and bonded to the flat superimposed surfaces of the end contact member, a fused layer disposed between and bonded to the flat superimposed surfaces of the end contact member and the silicon wafer, the fused layer consisting of an alloy of silver and at least one element selected from the group consisting of tin, silicon, germanium and lead, the alloy composed of at least 10% by weight of silver, and the alloy not exceeding 90% tin, not exceeding 16% silicon, not exceeding 50% lead and not exceeding 30% by weight of germanium, a second contact member of the same metal as the end contact member, the second contact member having a flat surface, a layer of a P-type material interposed between the second contact member and the other flat surface of the silicon wafer, the layer of P-type material disposed bonding the second contact member to the silicon wafer, the thin layer of P-type material selected from the group consisting of aluminum and alloys of aluminum with at least one element selected from the group consisting of silicon, germanium, gallium, and indium, the P-type material diffused into the silicon to convert the adjacent silicon to the P-type thereby providing a P-N junction.

4. A semiconductor rectifier diode comprising, in combination, a flat end contact member of molybdenum, a thin fragile flat wafer of silicon having N-type conductivity superposed on the end contact member, a fused layer disposed between and bonding the silicon wafer to the end contact, the fused layer comprising an alloy of from 2% to 5% germanium, a small amount of dissolved silicon and the balance being silver, a second contact member with a flat surface superposed on the other surface of the silicon wafer, a thin layer of fused aluminum material selected from the group consisting of aluminum and alloys of aluminum with at least one element selected from the group consisting of silicon, germanium, indium and gallium, disposed between and bonding the silicon wafer to the second contact member, the aluminum material from the fused layer penetrating into and producing an adjacent layer in the silicon wafer with P-type conductivity.

5. In an air-cooled semiconductor rectifier device, in combination, a sealed metallic casing, the casing including insulating means passing an electrical conductor through the walls of the casing, a semiconductor P-N junction rectifier soldered to the wall of the casing so as to convey rapidly to the casing heat developed during operation of the rectifier, the rectifier comprising an end contact member which has one surface soldered to the metallic casing, the end contact member composed of a metal selected from the group consisting of molybdenum, tungsten, and base alloys thereof having a coefficient of thermal expansion corresponding closely to that of silicon, a silicon wafer having N-type conductivity superposed on another surface of the end contact member, a fused layer disposed between and bonded to the said another surface of the end contact and a surface of the silicon wafer, the fused layer consisting of an alloy composed of silver and at least one element selected from the group consisting of tin, silicon, germanium and lead, the alloy composed of at least 5% by weight of silver and the balance not exceeding 95% by weight of tin, not exceeding 20% by weight of silicon, not exceeding 50% by weight of germanium and not exceeding 95% by weight of lead, an upper contact member of the alloy employed for the end contact member disposed immediately above the silicon wafer, a thin fused layer of P-type material disposed between and bonded to another surface of the silicon wafer and to the upper contact member, the P-type aluminum material selected from the group consisting of aluminum and alloys of aluminum with at least one element selected from the group consisting of silicon, germanium, indium, and gallium, the P-type aluminum material being diffused into the silicon wafer to convert the adjacent silicon to P-type conductivity, thereby producing a P-N junction, electrical conductors connected to the upper contact member, and radiator means connected to the casing to dissipate to the atmosphere heat imparted by the rectifier to the metallic casing.

6. The rectifier device of claim 5, wherein the radiator means comprises a body of metal having a cavity within which the metallic casing fits closely and is soldered therein to provide good metal-to-metal contact.

7. In an air-cooled semiconductor rectifier device, in combination, a sealed metallic casing, the casing including insulating means passing an electrical conductor through the walls of the casing, a semiconductor P-N junction rectifier in contact with the wall of the casing so as to convey rapidly to the casing heat developed during operation of the rectifier, the rectifier comprising an end contact member which has one surface soldered to the metallic casing, the end contact member composed of molybdenum, a silicon wafer having N-type conductivity superposed on another surface of the end contact member, a fused layer disposed between and bonded to the said another surface of the end contact and a surface of the silicon wafer, the fused layer consisting of an alloy composed of silver, silicon and germanium, the germanium comprising between 2% and 5% by weight, a small amount of silicon and the balance being silver, an upper contact member of molybdenum, a thin fused layer of P-type material disposed between and bonded to another surface of the silicon wafer and to the upper contact member, the P-type aluminum material selected from the group consisting of aluminum and alloys of aluminum with at least one element selected from the group consisting of silicon, germanium, indium and gallium, the P-type aluminum material being diffused into the silicon wafer to convert adjacent silicon to P-type conductivity, thereby producing a P-N junction, electrical conductors connected to the upper contact member, and radiator means connected to the casing to dissipate to the atmosphere heat imparted by the rectifier to the metallic casing.

8. In the process of producing a semiconductor rectifier device, the steps comprising heating to a maximum temperature of between 850° C. and 925° C. in a vacuum, a superimposed assembly of (1) an end contact member composed of a metal from the group consisting of molybdenum, tungsten and base alloys thereof having a coefficient of thermal expansion corresponding closely to that of silicon, (2) a thin layer of a thickness of the order of from 1 to 2 mils of an alloy of silver and at least one element selected from the group consisting of tin, silicon, germanium and lead, the alloy composed of at least 5% by weight of silver and the balance not exceeding 95% by weight of tin, not exceeding 20% by weight of silicon, not exceeding 50% by weight of germanium and not exceeding 95% by weight of lead, (3) a wafer of a thickness of the order of 10 mils of N-type silicon, (4) a thin layer of the order of from 1 to 2 mils of aluminum material selected from the group consisting of aluminum and alloys of aluminum with at least one element selected from the group consisting of silicon, germanium, indium and gallium, capable of conferring P-type conductivity to silicon, and (5) another contact of the same metal as the end contact, the assembly being under light pressure, whereby the thin layer of the silver alloy fuses and the thin layer of aluminum material fuses to the upper contact and the silicon wafer, and diffuses into the silicon wafer to convert the adjacent silicon into P-type silicon, and then cooling the assembly, thereby producing a bonded unitary rectifier member having a P-N junction.

References Cited in the file of this patent

UNITED STATES PATENTS

| | | |
|---|---|---|
| 2,662,997 | Christensen | Dec. 15, 1953 |
| 2,689,930 | Hall | Sept. 21, 1954 |
| 2,701,326 | Pfann et al. | Feb. 1, 1955 |

UNITED STATES PATENT OFFICE

CERTIFICATE OF CORRECTION

Patent No. 2,763,822 September 18, 1956

Frank V. Frola et al.

It is hereby certified that error appears in the above numbered patent requiring correction and that the said Letters Patent should read as corrected below.

Column 8, line 74, to column 9, line 1, strike out "a fused layer disposed between and bonded to the flat superimposed surfaces of the end contact member,".

Signed and sealed this 20th day of August 1963.

(SEAL)
Attest:

ERNEST W. SWIDER
Attesting Officer

DAVID L. LADD
Commissioner of Patents